(12) United States Patent
Schmid et al.

(10) Patent No.: US 7,016,200 B2
(45) Date of Patent: Mar. 21, 2006

(54) MODULE SUPPORT FOR ELECTRICAL/ELECTRONIC COMPONENTS

(75) Inventors: Roland Schmid, Stuttgart (DE); Thomas Uhland, Pfaffenhofen-Weiler (DE); Kai Beckbissinger, Stuttgart (DE); Ralf Schinzel, Marbach am Neckar (DE); Udo Hennel, Victoria Glen Waverly (AU)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 10/399,651

(22) PCT Filed: Oct. 16, 2001

(86) PCT No.: PCT/DE01/03953

§ 371 (c)(1),
(2), (4) Date: Oct. 7, 2003

(87) PCT Pub. No.: WO02/34022

PCT Pub. Date: Apr. 25, 2002

(65) Prior Publication Data

US 2004/0047125 A1    Mar. 11, 2004

(30) Foreign Application Priority Data

Oct. 18, 2000    (DE) ................ 100 51 547

(51) Int. Cl.
*H05K 7/02*    (2006.01)
*H05K 7/04*    (2006.01)

(52) U.S. Cl. .......... 361/813; 361/807; 361/809; 361/760; 361/723; 174/252; 174/260; 174/261

(58) Field of Classification Search .......... 361/748, 361/760, 813, 772, 777–779, 728, 736, 774, 361/807–810, 720–723; 174/250, 260, 262, 174/252, 255–257, 261, 267

See application file for complete search history.

(56) References Cited

U.S. PATENT DOCUMENTS

| 3,216,089 A | | 11/1965 | Dettman | |
|---|---|---|---|---|
| 3,670,409 A | * | 6/1972 | Reimer | 29/853 |
| 3,978,375 A | | 8/1976 | Fukui et al. | |
| 4,950,173 A | * | 8/1990 | Minemura et al. | 439/82 |
| 5,342,992 A | * | 8/1994 | Noto | 174/52.4 |
| 5,451,720 A | * | 9/1995 | Estes et al. | 174/250 |

(Continued)

FOREIGN PATENT DOCUMENTS

DE    296 22 806    10/1997

(Continued)

*Primary Examiner*—Kamand Cueno
*Assistant Examiner*—Dameon E. Levi
(74) *Attorney, Agent, or Firm*—Kenyon & Kenyon

(57) ABSTRACT

In a module frame for electronic components, having a conductor structure having a metallic conductor, at least one contact segment of a metallic conductor, the at least one contact segment of the metallic conductor uncovered by the insulation sheathing and conductively connected to a segment of the metallic conductor, the thermal conduction cross section of the at least one connecting web being designed to be so small that when the contact segment is intensely heated, the connecting web has a throttling effect on the heat flow to the segment of the conductor.

6 Claims, 3 Drawing Sheets

U.S. PATENT DOCUMENTS

| | | | |
|---|---|---|---|
| 6,200,143 B1 * | 3/2001 | Haba et al. | 439/70 |
| 6,235,994 B1 * | 5/2001 | Chamberlin et al. | 174/252 |
| 6,329,605 B1 * | 12/2001 | Beroz et al. | 174/256 |
| 6,374,487 B1 * | 4/2002 | Haba et al. | 29/840 |
| 6,428,328 B1 * | 8/2002 | Haba et al. | 439/70 |
| 6,538,879 B1 * | 3/2003 | Jiang | 361/683 |

FOREIGN PATENT DOCUMENTS

| | | |
|---|---|---|
| JP | 068289 | 6/1999 |
| WO | WO 00 51141 | 8/2000 |

* cited by examiner

MODULE SUPPORT FOR ELECTRICAL/ELECTRONIC COMPONENTS

FIELD OF THE INVENTION

The present invention relates to a module frame for electronic components.

BACKGROUND INFORMATION

A module frame for electronic components is known, for example, from German Utility Model 296 22 806 U1 and includes a conductor structure formed by a pressed screen and a plurality of metallic conductors incorporated into an insulation sheathing. The conductor structure is usually punched out of sheet metal and then encased in plastic in an injection molding method. After punching, the individual conductors may at first remain joined by thin webs, which may then be separated before or even after sheathing with plastic through cutouts provided in the sheathing. Such module frames are used, for example, to join large heavy electric components or components operating at a high amperage to one another and to other electric components. To this end, contact regions of the module frame are provided, each including a contact segment of an electric conductor which is freely accessible through cutouts in the insulation sheathing. The connecting elements of the electric or electronic components are soldered, welded or joined electrically to the contact segments by clamp contacting. In soldering the connecting element, the contact segments are heated to a high temperature. One disadvantage of the known module frames having a pressed screen is that the heat transmitted from the contact segments directly to the segments of the metallic conductors surrounded by the insulation sheathing is capable of damaging the insulation sheathing of the module frame.

SUMMARY OF THE INVENTION

Using the module frame according to an embodiment of the present invention, the heat transmitted to the contact segments of a module frame, in soldering in particular, is not allowed to flow unhindered to the parts of the conductor structure surrounded by the insulation sheathing. Due to the special design of the electric conductors in the continuous cutouts of the module frame, heat may flow only through connecting webs having a smaller thermal conduction cross section. The connecting webs throttle the heat flow to the segments of the pressed screen surrounded by the insulation sheathing. Damage to the module frame when the contact segments of the metallic conductors are heated to a high temperature may thus be prevented to advantage. In addition, in soldering the connecting elements of a component to the contact segments of the conduction screen in particular, the process heat required for soldering remains at the soldering point. Therefore, selective soldering of the individual solder points may be achieved with small solder pots or solder dies to advantage, which results in a definite improvement in soldering quality. The connecting elements of electronic components may be soldered to the contact segments in one method step to advantage. The structural design of the contact regions of the module frame is manufacturable in a simple and inexpensive manner without any increased expense.

In an embodiment of the present invention the contact segments of the conductor structure are designed in the form of soldered eyelets having a central opening for passing through one connecting element of an electric/electronic component for each eye. This measure makes it possible to mount the component on the module frame in a procedure similar to that used in the production of circuit boards, where the connecting elements of a component are inserted into the openings of the soldered eyelets and may then be soldered.

In another embodiment the at least one connecting web by which the contact segment is connected to the conductor structure is bent up out of the plane of the conductor structure, so that the contact segment is situated inside or outside the cutout in a plane parallel to the plane of the conductor structure. This greatly facilitates soldering of the connecting elements of a component. Due to the bending of the connecting web, it is possible in particular to achieve a complete immersion of the contact segment in the solder pot in particular in selective soldering using a solder pot, and thus it is possible to improve soldering quality.

In another embodiment the at least one connecting web is bent by deep drawing. This ensures, first of all, that the contact segment is bent into a defined position while the tapering of the thermal conduction cross section of the at least one connecting web produced by deep drawing further increases the effect of same as a poor heat conductor.

In another embodiment the segment of the metallic conductor situated on the inside wall of the cutout is at least in part uncovered by the insulation sheathing. This achieves the result that the heat being dissipated over the connecting webs does not come in direct contact with the segments of the conductor structure introduced into the insulation material.

In another embodiment of the present invention, the segment situated on the inside wall of the cutout has an annular shape; the contact segment is concentric with the segment situated on the inside wall, and the at least one connecting web joins the annular segment to the contact segment in the radial direction.

DETAILED DESCRIPTION

Figure 1:
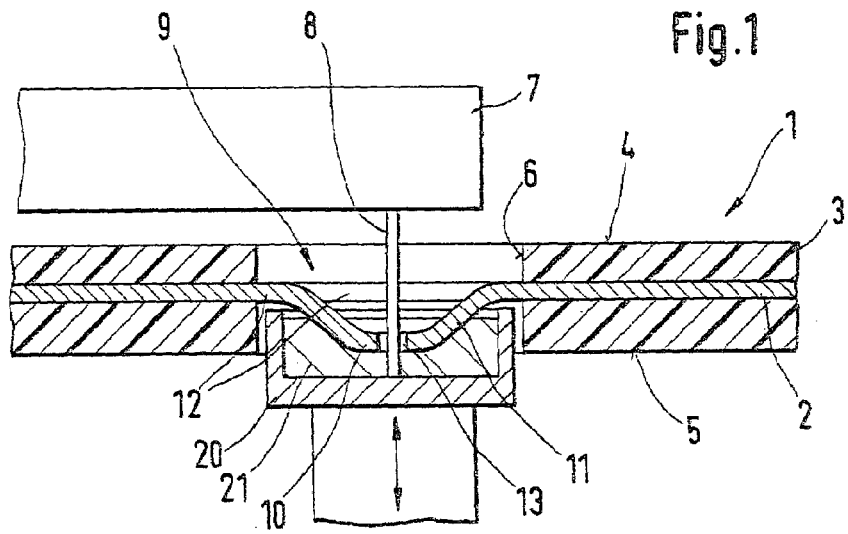
FIG. 1 shows a cross section through a module frame according to the present invention at the site of a contact region during soldering of a component.

FIG. 1 shows a module frame 1, which includes a conductor structure that is formed from an essentially flat pressed screen and is composed of a plurality of metallic conductors 2. The conductor structure is produced by punching a thin sheet metal having a thickness of 1.2 mm, for example. By sheathing with a thermoplastic material, conductors 2 are embedded approximately in the center of an insulation sheathing 3, contact regions 9 of conductors 2 being uncovered by the plastic sheathing. Module frame 1 is designed in the form of a plate having a top side 1 and a bottom side 5. The cross-sectional diagram in FIG. 1 shows one of conductors 2.

Figure 2A:
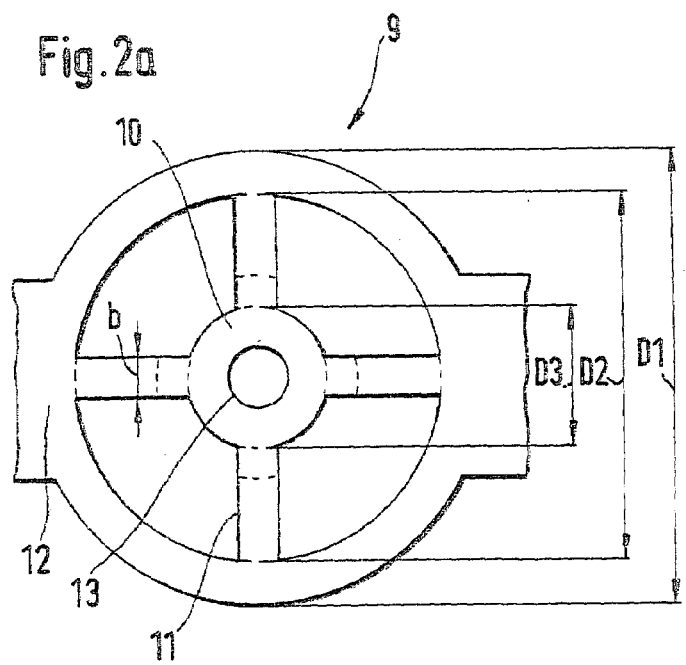
FIGS. 2a and 2b show a top view and a side view of one of the conductors of the conductor structure having the contact segment and connecting webs.

A cutout 6 in the insulation sheathing 3 going from top side 4 to bottom side 5 permits access to a contact segment 10 of conductor 2, this contact segment being situated completely in cutout 3 and connected by only narrow connecting webs 11 to a segment 12 of conductor 2 situated on the inside wall of cutout 6. As shown in FIG. 2a, in the exemplary embodiment shown here, segment 12 situated on the inside wall of cutout 6 is designed with an annular shape having an outside diameter D1 of 9.4 mm and an inside diameter D2 of 7.6 mm, for example. The contact segment is formed by a soldered eyelet 10, which is concentric with segment 12 and has an outside diameter D3 of 2.9 mm, for example. Soldered eyelet 10 is connected to annular segment 12 by four connecting webs 11 having a width b of 0.9 mm, for example, and protruding from the soldered eyelet in the radial direction.

Figure 2B:
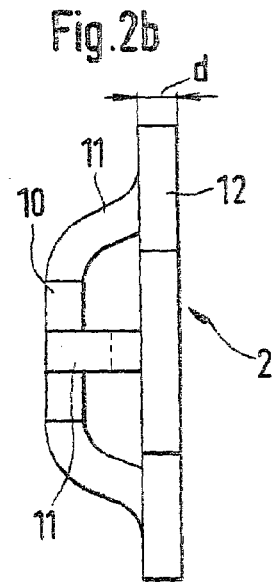

As also shown in FIGS. 1 and 2b, connecting webs 11 are bent over by deep drawing so that contact segment 11 within annular cutout 6 is in a plane on bottom side 5 of the module frame parallel to the plane of conductor structure 2. However, it is also possible to bend connecting webs 11 over so that contact segment 10 is situated, e.g., beneath bottom side 5 of module frame 1 and outside of cutout 6. In selective soldering of contact segment 10 to a connecting element 8 of an electric and/or electronic component, first, the connecting element is inserted into an opening 13 in contact segment 10 and then a solder pot 20 filled with solder 21 is inserted into cutout 6. Due to the bending of connecting webs 11 of conductor 2, contact segment 10 may be immersed completely in the heated and liquefied solder 21, thus achieving improved soldering of connecting element 8 to contact segment 10. If contact segment 10 projects away from bottom side 5 of the module frame, wave soldering of contact segments 10 is also conceivable in this case.

Figure 3:
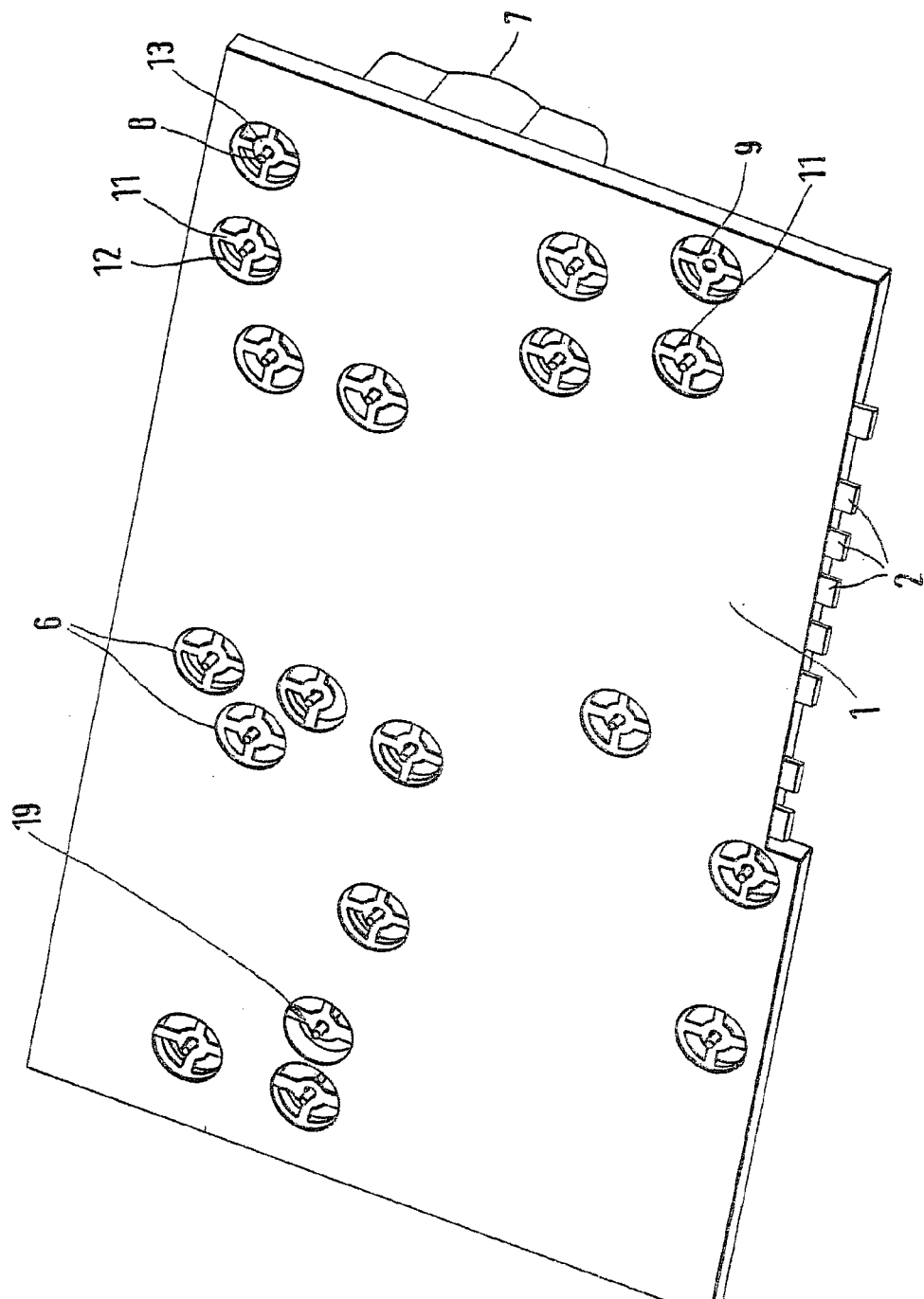
FIG. 3 shows the module frame having components mounted on it.

The heat transmitted to contact segment 10 during soldering flows in part to connecting webs 11. These have only a small thermal conduction cross section, so connecting webs 11 cause throttling of the heat flow to segment 12 of metallic conductor 2. Good heat throttling and a good electric conductivity of a connecting web 11 are achieved in the case of a pressed screen having a thickness d if thermal conduction cross section Q of connecting web 11 approximately satisfies the condition $d^2<Q<4d^2$. These values should be regarded only as guideline values. In any case, the thermal conduction cross section of connecting web 11 should be much smaller than the thermal conduction cross section of segment 12, which is situated in cutout 6 and is connected to the other segments of metallic conductor 2. Only this method yields adequate throttling of the heat dissipated to the segments of conductor 2 embedded in the insulation material. Contact region 9 functions more or less as a heat sink. As shown in FIGS. 1 and 3, segment 12 is only partially embedded in the insulation material. However, the inside part of annular segment 12 is removed from the insulation sheathing. These measures achieve the result that heat dissipated by the connecting webs does not flow directly to plastic 3.

Figure 4:
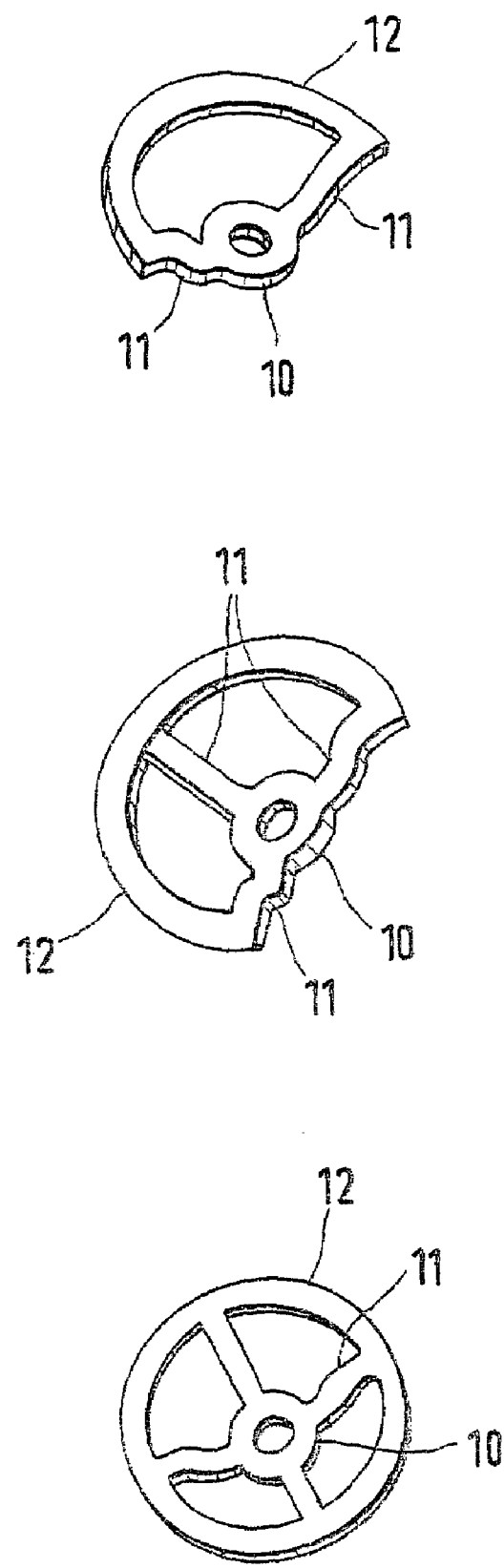
FIG. 4 shows additional exemplary embodiments of the design of the contact region of a module frame.

In other exemplary embodiments, it is possible to provide for a larger or smaller number of connecting webs 11. For example, FIG. 3 shows an exemplary embodiment of a module frame according to the present invention, in which there are contact regions 19 which include only three connecting webs 11 which are connected to a semicircular segment 12 on the inside wall of cutout 6. However, it is also conceivable to have other embodiments having only one, two, or more than four connecting webs. FIG. 4 shows a few possible exemplary embodiments. The remaining segments of conductors 2, which are connected in one piece to segment 12, are not shown here for the sake of simplicity. It is also possible to manufacture segments 10, 11 and 12 as separate parts which are to be contacted to conductors 2 in cutout 6.

What is claimed is:

1. A module frame for an electric/electronic component, comprising:
    a planar conductor structure including:
        an insulation sheathing, and
        a plurality of metallic conductors formed from a pressed screen and at least partially embedded in the insulation sheathing, wherein at least one contact segment of at least one of the plurality of metallic conductors provided for contacting a connecting element of the electric/electronic component is situated in a traversing cutout in the insulation sheathing; and
    at least one connecting web situated in the traversing cutout, wherein:
        the at least one contact segment is conductively connected to another segment of the at least one metallic conductor situated on an inside wall of the traversing cutout only by the at least one connecting web,
        a thermal conduction cross section of the at least one connecting web is so small that when the at least one contact segment is intensely heated, the at least one connecting web has a throttling effect on a heat flow to the other segment,
        the other segment has a larger thermal conduction cross section, and
        the at least one connecting web is bent up out of a plane of the planar conductor structure, so that the at least one contact segment connected to the at least one connecting web is situated one of inside and outside the traversing cutout in a plane parallel to the plane of the conductor structure.

2. The module frame as recited in claim 1, wherein the at least one contact segment is a soldered eyelet having a central opening for passing the connecting element therethrough.

3. The module frame as recited in claim 1, wherein the at least one connecting web is bent over by deep drawing.

4. The module frame as recited in claim 1, wherein the other segment is at least partially uncovered by the insulation sheathing.

5. The module frame as recited in claim 1, wherein the other segment has an annular shape, wherein the at least one contact segment is concentric with the other segment, and wherein the at least one connecting web joins the other segment to the at least one contact segment in a radial direction.

6. The module frame as recited in claim 3, wherein a conical taper of the thermal conduction cross section of the at least one connecting web is produced by deep drawing.

* * * * *